United States Patent [19]

Simon

[11] Patent Number: 4,590,667
[45] Date of Patent: May 27, 1986

[54] METHOD AND APPARATUS FOR ASSEMBLING SEMICONDUCTOR DEVICES SUCH AS LEDS OR OPTODETECTORS

[75] Inventor: Ralph E. Simon, Clifton, N.J.

[73] Assignee: General Instrument Corporation, New York, N.Y.

[21] Appl. No.: 643,064

[22] Filed: Aug. 22, 1984

[51] Int. Cl.⁴ .................... H01L 21/56; H01L 21/60
[52] U.S. Cl. ........................... 29/589; 29/588; 29/583; 29/576 S; 29/569 L; 148/DIG. 28
[58] Field of Search .................. 29/569 L, 576 S, 583, 29/588, 589, 411, 412, 413, 414, 415, 417; 148/DIG. 28

[56] References Cited

U.S. PATENT DOCUMENTS

| 3,490,141 | 1/1970 | Lesk | 29/589 |
| 3,497,948 | 3/1970 | Wiesler et al. | 29/583 |
| 3,568,307 | 3/1971 | Zanger et al. | 29/589 |

FOREIGN PATENT DOCUMENTS

| EP78037 | 5/1979 | European Pat. Off. | 29/569 L |
| EP75491 | 3/1983 | European Pat. Off. | 29/576 S |
| 18992 | 2/1978 | Japan | 29/569 L |
| 55391 | 5/1979 | Japan | 29/569 L |
| 37889 | 3/1982 | Japan | 29/569 L |

Primary Examiner—Brian E. Hearn
Assistant Examiner—Hunter L. Auyang
Attorney, Agent, or Firm—Kramer and Brufsky

[57] ABSTRACT

A wafer divided into rows of abutted end-to-end dice (i.e., semiconductor chips) is placed on a thin, non-elastic membrane and drawn tightly over a knife-edge to successively separate each row of dice from the membrane. The dice are then attached to individual leadframes directly or are picked up by a vacuum fixture and carried to a position where they are secured to the leadframes and are wire bonded. After bonding, the components are assembled into finished subassemblies. In one embodiment, LED lamps are fabricated. A reflector is secured to each leadframe over the die positioned thereon, and the leadframe, die and reflector are molded into a lamp subassembly, which is used to form a larger lamp or display fixture.

13 Claims, 15 Drawing Figures

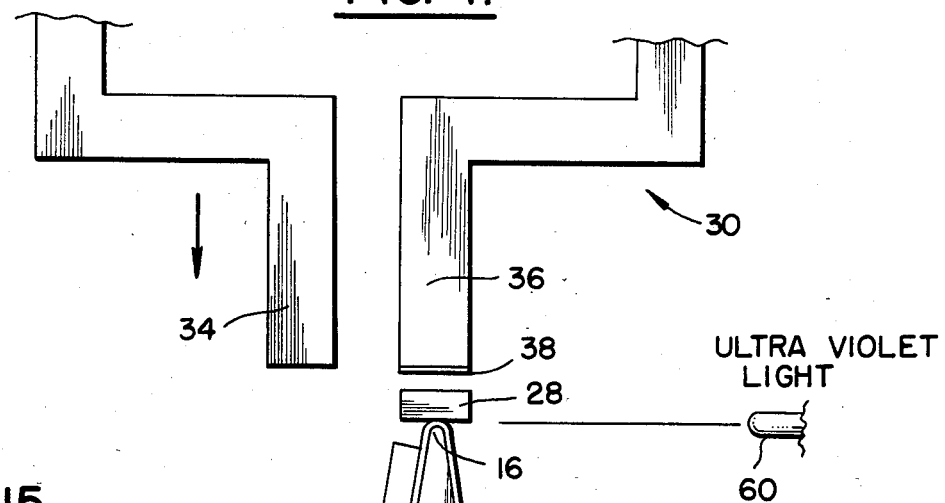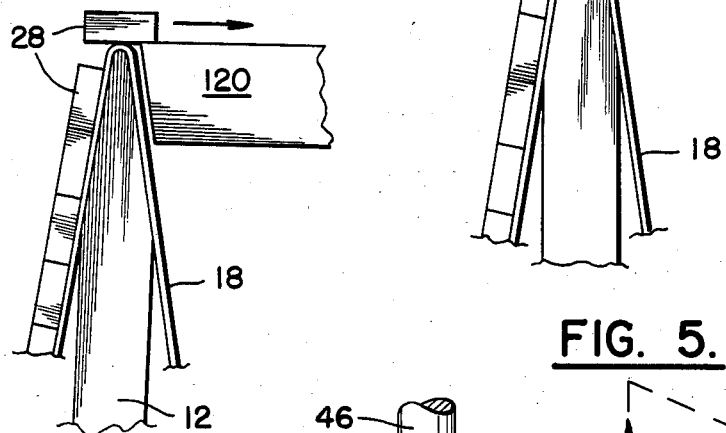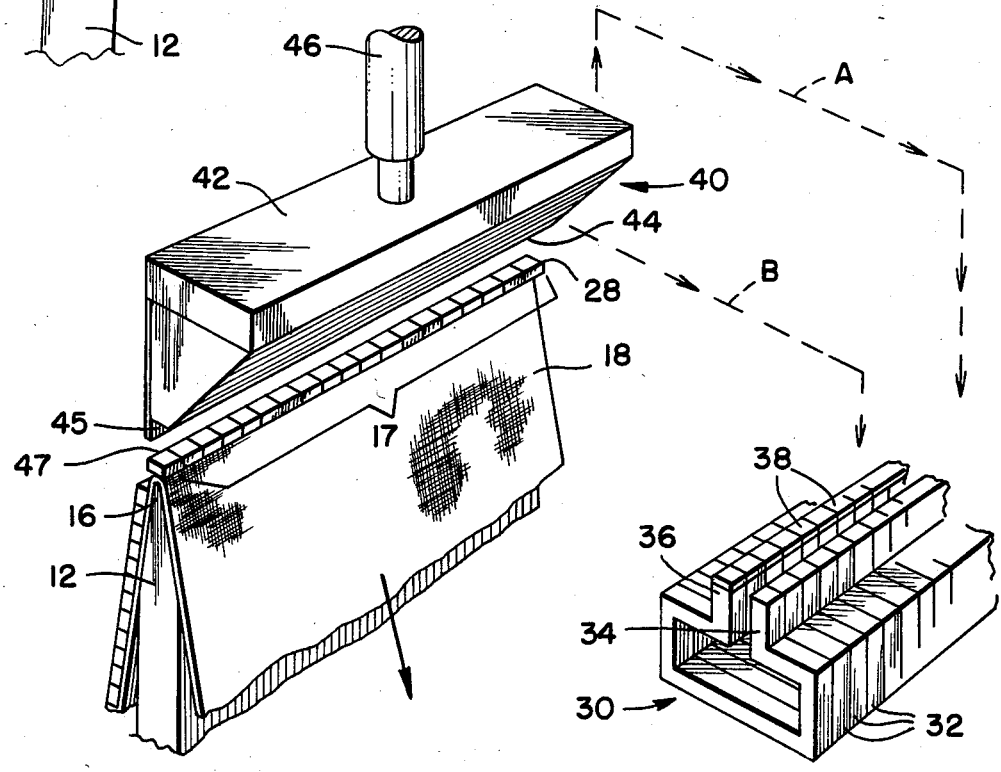

METHOD AND APPARATUS FOR ASSEMBLING SEMICONDUCTOR DEVICES SUCH AS LEDS OR OPTODETECTORS

BACKGROUND OF THE INVENTION

This invention relates to a method and apparatus for assembling semiconductor chips or "dice" into devices such as LED lamps, detectors, displays, optoisolators, optoswitches and arrays of emitters and/or detectors. The semiconductor components described are light emitting chips and light sensing detectors, but the invention is also applicable to other components such as integrated circuit chips.

Typically, light emitting diodes ("LED"s) and detectors are produced from large wafers containing thousands of individual emitter diodes or detector transistors. The wafers are mounted on a membrane and divided into dice (each die usually comprising a single LED or detector) by sawing, or scribing and breaking. The membrane is stretched to separate the dice, and an automatic die attaching machine is used to pick up the dice one at a time and place them on a leadframe, which has been pre-coated one unit at a time with conducting epoxy to make one of the required electrical connections to the die. Typical speed for such a machine is 3,000 units per hour and leadframe spacing is typically 3 per inch. The pick-up mechanism on the die attaching machine usually requires automatic pattern recognition, since after the membrane is stretched, the exact location of the dice is lost.

After the die attaching operation, the leadframe is moved to a die bonding machine and a fine wire is attached between the top metal contact on the die and the second lead on the leadframe. This operation is typically performed at a rate of 3,000 to 5,000 units per hour, limited by the large spacing between leadframes and the precise position of the bond. The leadframe is then inverted and inserted into a mold and a thermosetting epoxy is cast around the leadframe. The epoxy is cured by heating in an oven for approximately 30 minutes. After molding, the leadframes are cut apart into individual devices (e.g., lamps or detectors), tested, and binned according to brightness, color or other significant characteristics.

Displays differ in construction from the above in that many dice are placed on a single leadframe or circuit board. This is generally a slower and more costly process to perform using automatic equipment since the distance between dice is larger and positioning must be precise. The cost increases and speed decreases for automatic equipment as distance and precision of placement increases.

Two leadframes rather than one are usually used in the manufacture of optoisolators—one for the emitter and one for the detector. The detector frequently requires more than two contacts. The two leadframes are positioned in proximity to each other so that radiation from the emitter can impinge on the detector. The leadframes are usually molded twice—first with a transparent material and then with an opaque material. Optoisolator manufacturing is limited, as is display manufacturing, by the requirement for precise spacing of widely spaced dice on leadframes.

SUMMARY OF THE INVENTION

In contrast to the typical manufacturing process, the present invention concerns a method for producing LEDs and optodetectors at very high speed and low cost. The apparatus for accomplishing this method is also provided. The resulting device can be used as a subassembly for producing conventional LEDs, displays, optoisolators, optoswitches and arrays of emitters and detectors.

The method utilizes the formation of semiconductor components on a wafer which is then mounted on a thin, non-stretchable or expandable membrane. The wafer is then separated, e.g., by scribing and breaking, into individual dice. The wafers can be sawn rather than scribed and broken, in which case a 1-2 mil spacing between dice will be present. The membrane is mounted on a drum such that it can be drawn tightly over a knife-edge. By this means a row of tandem dice is exposed, spaced with spacing unchanged from the periodic spacing fixed by the pattern used for defining individual devices in the wafer form. By using a sharp edge and thin membrane relative to the dice width, the area of contact between a die and the membrane is minimized, thus minimizing the force holding the die to the membrane. Alternatively, an ultra-violet sensitive adhesive can be used to hold the dice on the membrane, which loses its adhesive properties when exposed to U.V. light.

Leadframes consisting of a series of wire clips made in the form of a row of staples, i.e. wire bent into the appropriate shape and held together by an adhesive applied to the surface, are then brought into proximity with the tandem dice. Electrically conductive epoxy is applied to one side of the row of frames by rolling a thin layer onto the surface thereof. Alternatively, epoxy can be applied to the dice by silk-screening prior to mounting on the knife-edge assembly. The leadframes, with epoxy applied either on the frames or the dice, are placed directly over the dice, aligned so that one die lines up with one wire frame, and pressed against the row of exposed dice. The frame is then lifted with the row of dice now attached to the row of frames. If U.V. sensitive adhesive is used, a U.V. light is flashed to facilitate the lifting of the dice from the membrane. Alternatively, the dice can be picked up by a vacuum assembly consisting of a fixture with a row of holes with the same spacing as the dice, the length of the fixture sufficient to cover an entire row of dice. The fixture is moved such that it places the dice on a pre-epoxied set of leadframes. The leadframes can then be separated, and formed into individual devices. Alternatively, the row of dice can be deposited by the fixture on a second membrane as a strip, and individual dice can then be separated from the strip in an orthogonal direction and placed on a leadframe for further processing to form final devices as described below.

The staple-like array of leadframes with the dice attached is processed using high speed wire bond equipment to attach a wire between the second lead of each leadframe and the remaining contact on the corresponding die. Since spacing is small and fixed, the wire bond equipment runs at very high speed. Further, since fixed spacing is retained, the die bonder may be operated without costly pattern recognition. The staple-like array of leadframes with dice attached and wires bonded can then be placed in a stapler-like device, the purpose of which is to separate the individual leadframes by injecting them into a holder for molding.

The stapler-like device may have a set of separators or wedges which separate the leadframes at the dice end in order to avoid interference of the leadframe with neighboring dice. Such undesirable interference would occur if the dice overlap a neighboring frame as a result of not being accurately aligned with the leadframe, or if the dice are not uniform in size as a result of uneven breaking.

The holder design permits the dice and a sufficient length of the leadframe to protrude. After insertion of the individual leadframes in the holder, a plastic reflector can be placed over the dice and held in place by epoxy adhesive. The holder is then placed on guide pins over a row of mold cups with spacing that is equal to the spacing of the leadframes in the holder. The mold cups are filled with a transparent plastic such as epoxy. The holder is lowered so that the dice and a portion of the leadframe is immersed in the plastic. The entire assembly consisting of holder, mold and leadframe is then placed in a curing oven to cause the plastic to set. Alternately, a U.V. sensitive epoxy can be used which hardens upon exposure to U.V. light. An injection molding technique or transfer molding technique could also alternatively be used. After the plastic hardens, the holder with the devices (e.g., lamps or detectors) in place is removed from the mold and the devices are removed from the holder.

In one embodiment of this invention, the holder is designed so that it contains a shear bar which when moved, shears off a portion of the leadframe. A strip of adhesive tape is then applied along the back of the holder which adheres to each device. The holder is then opened, and the individual devices are removed with the tape. The tape is then inserted in an automatic tester which tests the devices sequentially. The devices are then removed from the tape and binned according to appropriate characteristics.

By use of parallel pick-up, high speed bonding, staple-like leadframes and subassembly lamp structures, a wide variety of optoelectronic devices can be made in high volume at low cost, including low capital investment. In addition, commonality in manufacture of the devices simplifies production and maintenance. The use of parallel pick-up results in increased units produced per hour per machine; e.g., over 50,000 units per hour. High speed bonding with closely spaced dice is faster by 20%–30%.

BRIEF DESCRIPTION OF THE DRAWINGS

Further objects and advantages of the invention will become apparent from the following description and claims, and from the accompanying drawings, wherein:

FIG. 4 illustrates a step in the method of the present invention utilizing the apparatus of FIG. 1 and 2, and more particularly, the separation of a plurality of dice from the membrane and the attachment of the dice to the leadframes of FIG. 3;

FIG. 5 illustrates yet another mode of attaching the dice separated from the membrane to the leadframes wherein a vacuum pick-up device, shown schematically, is used to transfer a parallel row of the dice to the leadframes or another membrane.

FIG. 15 illustrates an alternative means for removing dice from the membrane using a picker bar mounted adjacent and just above the membrane on the downstream side of the knife-edge.

DETAILED DESCRIPTION OF THE PREFERRED EMBODIMENT

Figure 1:
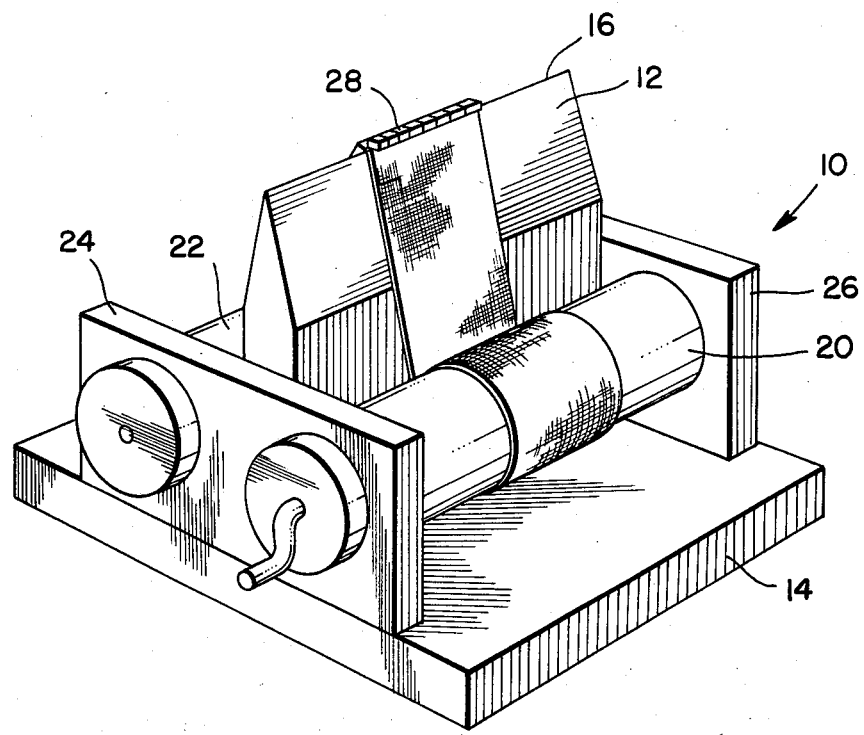
FIG. 1 is a perspective view of a wafer membrane mounting device used with the method of the present invention.

Referring now to the drawings in detail, wherein like numerals indicate like elements throughout the several views, the apparatus 10 used to practice the method of the present invention includes an inverted V-shaped member 12 mounted on a base plate 14 providing a knife-edge or line of contact 16 with a membrane 18 draped over the inverted V-shaped member 12 along the line of contact 16. The membrane 18 is thin and non-stretchable and is fed by a manually rotatable roller 20 over the knife-edge 16. The membrane 18 extends beneath the roller 20 as illustrated in FIG. 1 and an idler roller 22. The rollers 20 and 22 are mounted rotatably on opposite sides of the base plate 14 inside support plates 24 and 26.

Figure 2:
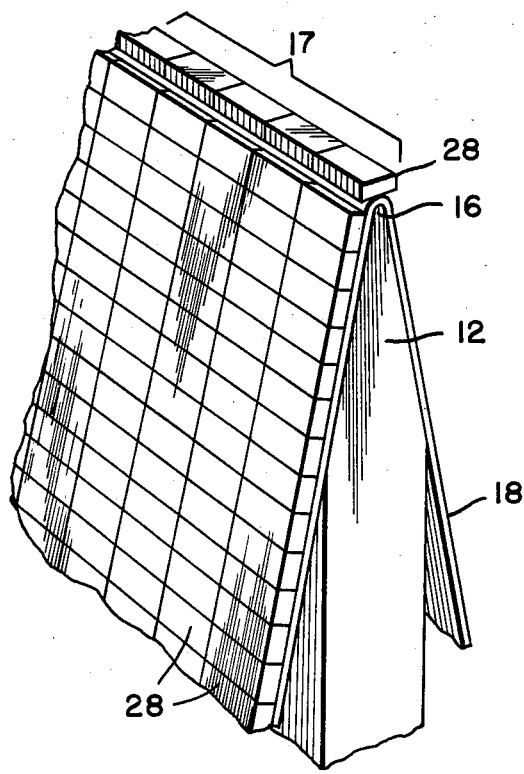
FIG. 2 is an enlarged perspective view of a portion of the apparatus of FIG. 1.

Light emitting diodes and detectors are produced from wafers containing thousands of diodes or transistors. A wafer is adhesively mounted on the membrane 18 and divided into dice 28 by sawing, or scribing and breaking. Membrane 18 is a conventional material available for use in the semiconductor industry, and is tacky on the surface thereof to which the wafer is mounted. As the drum 20 is rotated the membrane is drawn tightly over the knife-edge 16 to expose a row of tandem dice 17 along the top of the inverted V-shaped member 12 or knife-edge 16 as illustrated in FIG. 2. By this means a row of tandem dice 17 are exposed, spaced with spacing unchanged from the periodic spacing fixed by the pattern used for defining individual dice in each wafer. By using a sharp knife-edge 16 and thin membrane 18 relative to the width of each die 28, the area of contact between a die 28 and the membrane 18 is minimized, as the membrane passes over the knife-edge 16, thus minimizing the force holding each die 28 to the membrane. 18.

Normally, there is also a tendency for the knife-edge 16 to generate static electricity which attracts each die 28 to the membrane 18. The use of an ion stream (e.g., alpha particles) can be used to neutralize such static electricity in a conventional manner.

By use of the knife-edge 16 and non-stretchable membrane 18, there will be no spacing between the dice as they pass over the knife-edge and they will remain in substantial parallel orientation relative to the base 14 of the apparatus 10.

In order to further aid removal of the dice from the non-stretchable membrane 18, an ultra-violet sensitive adhesive can be used to hold the dice 28 to the surface of the membrane 18 instead of the conventional adhesive. A suitable ultra-violet light 60 (see FIG. 4) can be flashed to facilitate the lifting of the dice 28 from the membrane 18 as the dice pass over the knife-edge 16.

Figure 3:
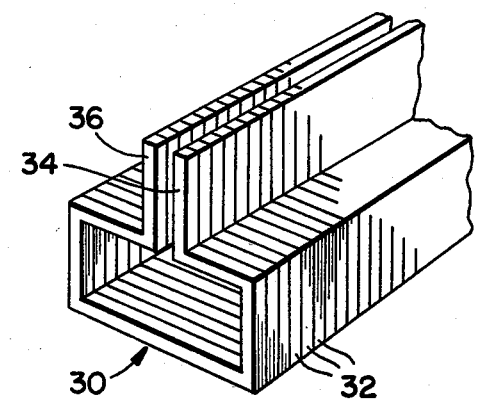
FIG. 3 is a partial perspective view of a series of bonded leadframes which are used with the method of the present invention.

As shown in FIG. 3, leadframes 30 consisting of a series of wire clips 32 bent into a substantial rectangular shape but having a pair of parallel legs 34 and 36 extending from one side thereof are held together by an adhesive applied to adjacent surfaces to form a row of staples. As shown in FIG. 4, one of the legs 36 of each of the wire clip leadframes 32 is brought into proximity with one of the dice 28 secured to membrane 18 on the top of knife-edge 16. Conductive epoxy 38 is applied to the bottom of each leg 36 in the row of leadframes 30 by rolling a thin layer of the epoxy onto this surface. Alternatively, the epoxy 38 can be applied to each die surface by silk-screening prior to mounting the membrane 18 on the apparatus 10.

The leadframes 32, with epoxy 38 applied either on the frames 32 or directly on top of the dice 28, are placed directly over the tandem row of dice 17 aligned so that one die 28 lines up with one wire or leadframe 32. The leadframes are then pressed against the row of exposed dice 28 and then the frames 32 are lifted with the row of dice 28 now attached to each leg 36 in the row of frames 32. If the ultra-violet sensitive adhesive is used to adhere the dice 28 to the membrane 18, an appropriate ultra-violet light 60 can be flashed to facilitate the lifting of the dice 28 from the membrane 18 upon contact of the dice with the epoxied leg 36 of each of the leadframes 32.

Alternatively, the dice 28 can be picked up by a vacuum assembly generally designated by the numeral 40 and illustrated in FIG. 5. The assembly consists of a fixture 42 provided with a row of holes along its bottom surface 44 with the same spacing as each of the dice 28 along the knife-edge 16 and of a length to cover a row 17 of the dice 28. Upon establishing a vacuum through a hose 46 connected to and in communication with the interior of fixture 42, the dice 28 will be removed from membrane 18 and held by the fixture 42. As shown in FIG. 5 the fixture 42 can be lifted and moved along path "A" shown to deliver the row 17 of dice 28 to the epoxied leg 36 of each of the staple-like leadframes 32, which are each oriented to receive one of the dice 28 in the row 17 carried by the fixture 42. Rather than deposit each die 28 on a leadframe 32, the vacuum fixture 42 can deposit the entire row of dice 28 on a second tacky membrane. The individual dice 28 can then be separated orthogonally for further processing.

Fixture 42 can also be provided with a lip 45 adjacent vacuum holes 44. Lip 45 will engage the edge 47 of each die 28 in row 17. When fixture 42 is moved along path "B" shown in FIG. 5, lip 45 will push row 17 of dice 28 away from knife-edge 16, thereby sliding the row off membrane 18. At the same time, vacuum holes 44 will hold the dice 28 to fixture 42 for subsequent deposit on leadframes 32. The use of lip 45 in this manner has been found to be very effective in overcoming the forces of static electricity which sometimes hold dice 28 onto membrane 18 too tightly for the vacuum pick off to overcome alone.

In another embodiment (FIG. 15), a picker bar or table 120 can be mounted adjacent and just above membrane 18 immediately downstream of knife-edge 16 in the direction of membrane travel. As dice 28 pass over knife-edge 16, they separate from membrane 18 and are scooped up and supported by picker bar 120.

As each row of dice 28 passes over knife-edge 16, it proceeds onto picker br 120 and pushes the previous row forward, so that the rows of dice will be continuously collected on picker bar 120. The dice can then proceed from picker bar 120 to further automated processing.

Figure 13:
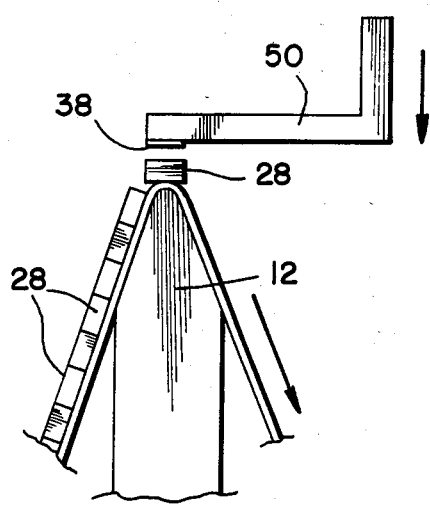
FIGS. 13 and 14 illustrate an alternative mode of attaching the dice to the leadframes utilizing the apparatus of FIGS. 1 and 2.
Figure 14:
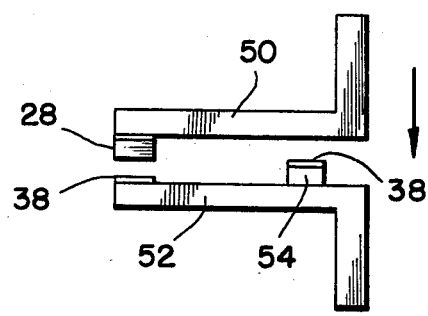

As illustrated in FIGS. 13 and 14, an alternative configuration of an optoelectronic device can be formed utilizing the method of the present invention. For example, in the formation of GaP based emitters, GaAs IR emitters or any emitter which is tansparent to the radiation produced, i.e., where emission comes from all surfaces, epoxy is used for both contacts tothe emitter, and the emitter is metalized on both sides with contact strips or contact dots. The leadframe in this type of lamp assembly consists of two L-shaped members 50 and 52 made up into staple-like configurations. The first L-shaped member 50 is used to pick up the die 28 from the membrane 18 using the side of the member rather than anend as described above. The side is provided with epoxy 38. The second L-shaped member 52, also provided with conductive epoxy 38, is now pressed against the other side of the die completing the two required contacts. An insulating block 54 of the same thickness as the die 28 can be mountedon the second L-shaped member 52 and attached simultaneously using epoxy 38 to provide a stronger assembly.

Figure 7:
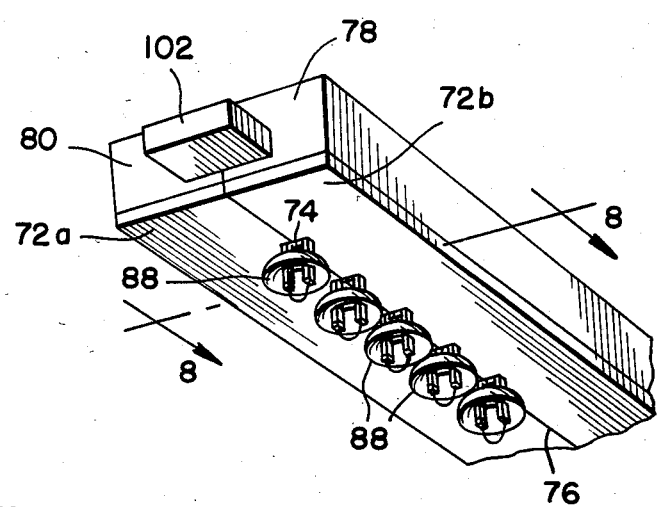
FIG. 7 is a partial perspective view illustrating the insertion of a plastic reflector on each leadframe in the holder of FIG. 6.
Figure 8:
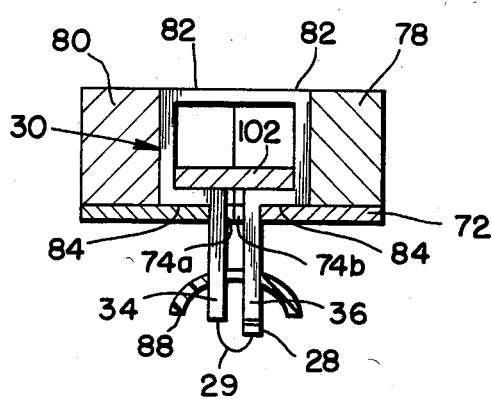
FIG. 8 is a cross-sectional view taken substantially along the plane indicated by line 8—8 of FIG. 7.

The staple-like array of leadframes 32 (as shown in FIGS. 4, 5, or 14) with dice 28 attached is then placed in high-speed wire bond equipment and a wire 29 is attached from the other contact on the die to the other lead in the leadframe. Since spacing is small and fixed, the wire bond equipment runs at a very high speed. Also, since spacing is retained by the method of the present invention, the bond equipment may be operated without costly pattern recognition. The staple-like array of leadframes with dice attached and wire bonded is now placed in a stapler-like device (not shown) or equivalent wherein the wire leadframes are separated and ejected into a holder 70, illustrated in FIGS. 6 to 8, prior to molding.

The holder 70 consists of a base 72 having a series of spaced openings 74 which permits the dice 28 and a sufficient length of the legs 34 and 36 of each leadframe 30 to protrude downwardly. The base 72 consists of a pair of abutted plates 72a and 72b formed with rectangular openings 74a and 74b along their abutted edge 76. Right and left blocks 78, 80, respectively, are provided each having upper and lower parallel openings 82, 84, respectively, in abutment. Openings 82, 84 receive leadframe 30, which is then surrounded by blocks 78, 80. Each block 78, 80 is received on pins 86 extending upwardly from plates 72a, 72b.

Figure 9:
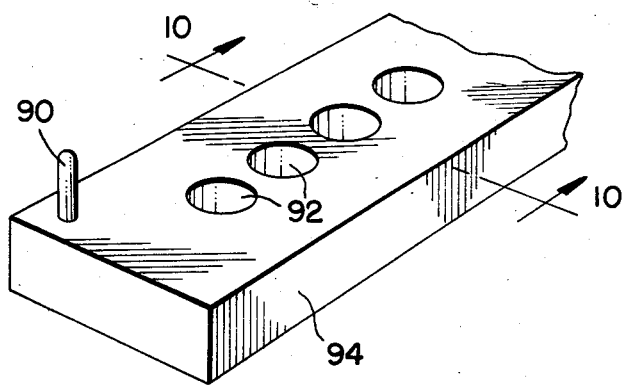
FIG. 9 is a partial perspective view of a fixture containing a row of mold cups into which the leadframes, reflectors and dice in the holder of FIGS. 7 and 8 are immersed.
Figure 10:
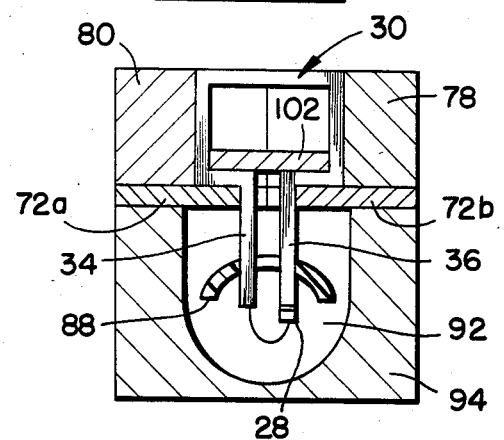
FIG. 10 is a cross-sectional view through the superimposed holder of FIG. 7 and fixture of FIG. 9.
Figure 11:
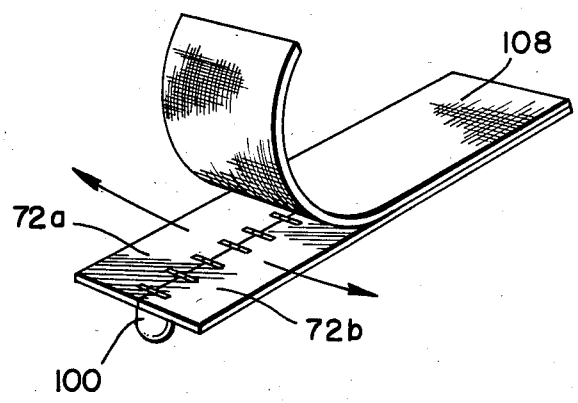
FIG. 11 is a partial bottom perspective view of the lamp holder after the individual lamps have been molded.
Figure 12:
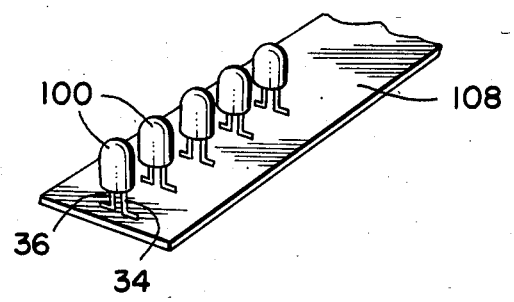
FIG. 12 is a partial top perspective view of the lamp holder of FIG. 11.

After insertion of the individual, separated leadframes 30 in the holder 70, a plastic reflector 88 can be placed behind the dice 28 and held in place by epoxy adhesive. Then, as shown in FIG. 9, holder 70 can be placed on guide pins 90 over a row of mold cups 92 in a mold 94. The spacing of mold cups 92 is equal to the spacing of the leadframes 30 in the holder 70. Mold cups 92 are filled with a transparent plastic such as epoxy. The holder is lowered as shown in FIG. 10 so that the dice 28 and the leg portions 34, 36 of the leadframe 30 are immersed in the plastic. The entire assembly consisting of holder 70, mold 94 and leadframe 30 is placed in a curing oven to cause the plastic to set. Alternatively, a U.V. sensitive epoxy can be used which hardens upon exposure to U.V. light or an injection molding technique or transfer molding technique can be used. After the plastic hardens, the holder 70 with the LED subassemblies ("lamps") 100 in place is removed from the mold 94 and the lamps 100 are removed from the holder.

Figure 6:
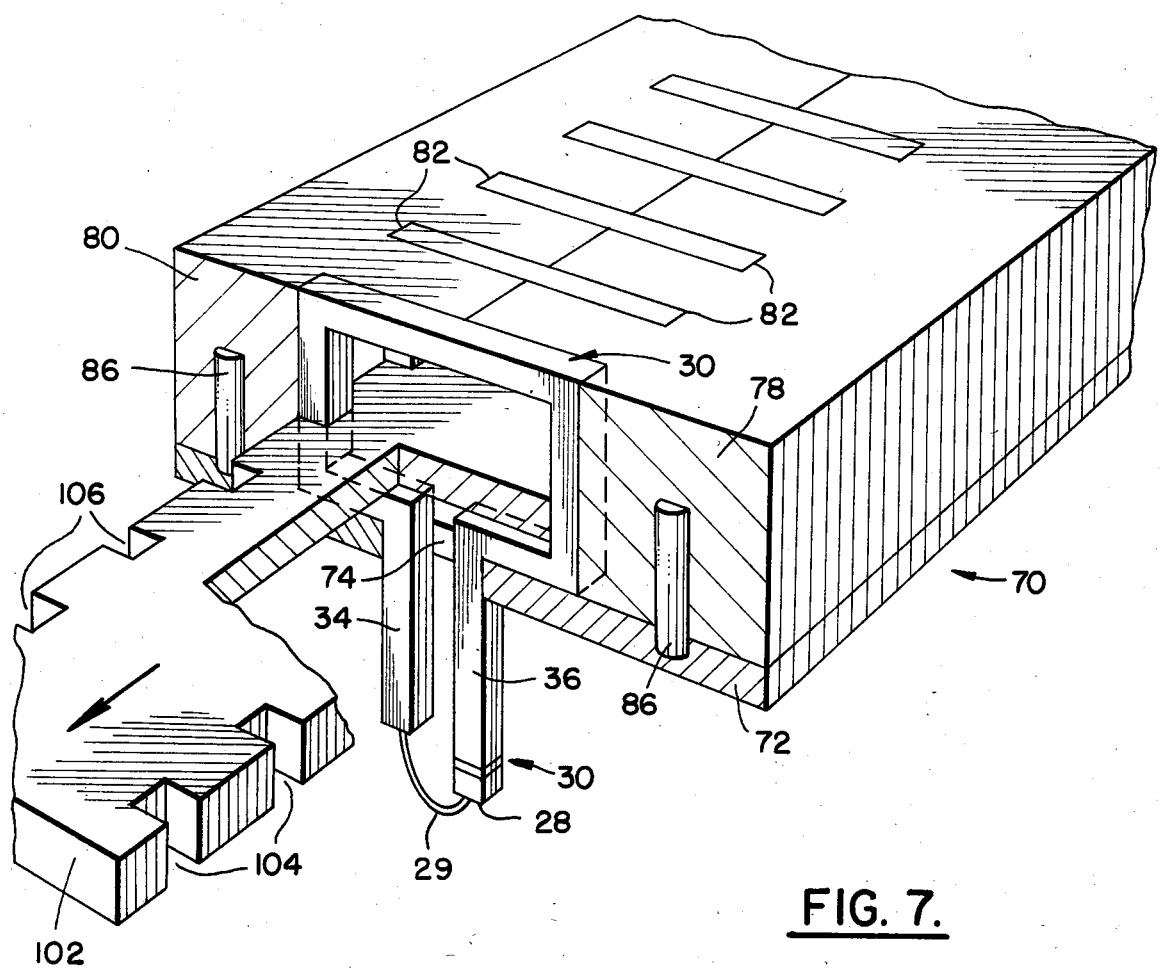
FIG. 6 is a perspective view, partly in section, of a holder for the individual leadframes and dice.

In the illustrated embodiment of this invention, the holder 70 is designed so that it contains a shear bar 102 having opposed slots 104, 106 surrounding the upper rectangular portion of each leadframe 30, which when moved, as shown in FIG. 6, shear off or break off that portion of the leadframe. This provides an operable subassembly (e.g., a lamp with two leads protruding therefrom).

After removal of blocks 78 and 80, a strip of adhesive tape 108 can be applied along the back of the holder base 72a, 72b which adheres to each lamp 100. The holder base 72a, 72b is then separated, and the individual lamps 100 are removed with the tape 108. The tape 108 is then inserted in an automatic tester which tests the lamps sequentially. The lamps 100 can then be removed from the tape 108 and binned according to appropriate characteristics (e.g., brightness and hue).

By use of parallel dice pick-up, high speed bonding, staple-like leadframes and subassembly lamp structures, a wide variety of semiconductor devices (e.g., LED lamps) can be made in high volume at low cost, including low capital investment. In addition, commonality in manufacture of the lamps 100 simplifies production and maintenance. The use of parallel pick-up of the dice results in increased units produced per hour per machine; e.g., over 50,000 units per hour. High speed bonding with closely spaced dice is faster by 20%-30%. The dice can be individually separated or formed into lamp units together as described above; each portion of the disclosed method resulting in increased volume and lower cost than had been achieved heretofore.

The lamp manufactured in accordance with the method described above is a subassembly for finished lamps and display products. Also, other forms of lamps or subassembly lamps can be produced by this method including lamps with horizontal leads, and lamps of a variety of shapes and sizes.

What is claimed is:

1. A method for mass producing semiconductor devices comprising the steps of:
   providing a thin, non-stretchable membrane,
   mounting a wafer containing multiple semiconductor components to said membrane,
   dividing said wafer into a plurality of dice arranged in an abutted end-to-end relationship in a plurality of parallel rows,
   disposing said membrane over a knife-edge to sequentially remove a portion of each die in each row simultaneously from said membrane as it passes over said knife-edge,
   transferring a row of said dice removed from said membrane by the knife-edge to a position in alignment with a corresponding row of leadframe members, and then
   simultaneously attaching each individual die in said removed row of dice to the leadframe member corresponding thereto in the row of leadframe members.

2. The method of claim 1 wherein said dice are transferred from said membrane by a vacuum pick up tool having a lip which engages an edge of each die and pushes said row of dice away from said knife-edge, thereby sliding the row off the membrane.

3. The method of claim 1 wherein the removal of said dice from said membrane is assisted by a picker bar mounted adjacent and just above said membrane immediately downstream of said knife-edge in the direction of membrane travel.

4. The method of claim 1 wherein dice are attached to said leadframe members by a conductive epoxy.

5. The method of claim 1 wherein said wafer is secured to said membrane by an ultraviolet sensitive adhesive, and comprising the further step of
   flashing an ultraviolet light as said membrane is passed over said knife-edge to sequentially loosen rows of said dice.

6. The method of claim 1 wherein said dice are optoelectronic components, and including the step of attaching a light reflector to each of said members leadframe adjacent to the die attached thereon.

7. The method of claim 6 including the further step of encapsulating said leadframe members dice and reflectors in plastic to form a plurality of lamp assemblies.

8. The method of claim 7 wherein said encapsulation is carried out by:
   simultaneously immersing said leadframe members, dice and reflectors in a mold filled with plastic, and curing said plastic.

9. The method of claim 8 including the step of
   cutting said leadframe along a portion exterior of said mold.

10. The method of claim 9 including the step of coupling a plurality of said leadframe members after said cutting step with a strip of adhesive tape, and
    testing said lamp assemblies, while coupled together via their associated leadframe members by said adhesive tape, to determine their operability.

11. A method for separating dice from a wafer to form semiconductor devices comprising the steps of:
    providing a thin, non-stretchable membrane,
    mounting a wafer containing multiple semiconductor components on said membrane,
    dividing said wafer on said membrane into a plurality of dice arranged in an abutted end-to-end relationship in a plurality of parallel rows,
    disposing said membrane over a knife-edge to sequentially remove a portion of each die in each row simultaneously from said membrane as it passes over said knife-edge, and
    removing a row of said dice from said membrane with a vacuum pick up tool having a lip that engages an edge of each die and pushes said row of dice away from said knife-edge, thereby sliding the row off the membrane.

12. A method for separating dice from a wafer to form semiconductor devices comprising the steps of:
    providing a thin, non-stretchable membrane,
    mounting a wafer containing multiple semiconductor components on said membrane,
    dividing said wafer on said membrane into a plurality of dice arranged in an abutted end-to-end relationship in a plurality of parallel rows, disposing said membrane over a knife-edge to sequentially remove a portion of each die in each row simultaneously from said membrane as it passes over said knife-edge, and removing a row of said dice from said membrane with a picker bar mounted adjacent and just above said membrane immediately downstream of said knife-edge in the direction of membrane travel.

13. A method for separating dice from a wafer to form semiconductor devices comprising the steps of:

providing a thin, non-stretchable membrane, mounting a wafer containing multiple semiconductor components on said membrane using an ultraviolet sensitive adhesive, dividing said wafer on said membrane into a plurality of dice arranged in an abutted end-to-end relationshop in a plurality of parallel rows, disposing said membrane over a knife-edge to sequentially remove a portion of each die in each row simultaneously from said membrane as it passes over said knife-edge, and flashing an ultraviolet light at said knife-edge as said membrane is passed over the knife-edge to sequentially loosen a row of dice.

* * * * *